US010998049B1

(12) United States Patent
Wei et al.

(10) Patent No.: US 10,998,049 B1
(45) Date of Patent: May 4, 2021

(54) METHOD OF PROGRAMMING MEMORY DEVICE AND RELATED MEMORY DEVICE

(71) Applicant: Yangtze Memory Technologies Co., Ltd., Wuhan (CN)

(72) Inventors: Wenzhe Wei, Wuhan (CN); Hongtao Liu, Wuhan (CN); Kaikai You, Wuhan (CN); Da Li, Wuhan (CN); Ying Huang, Wuhan (CN); Yali Song, Wuhan (CN); Dejia Huang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/705,152

(22) Filed: Dec. 5, 2019

Related U.S. Application Data (63) Continuation of application No. PCT/CN2019/112653, filed on Oct. 23, 2019.

(51) Int. Cl.
| | | |
|---|---|---|
| *G11C 16/12* | (2006.01) | |
| *G11C 16/24* | (2006.01) | |
| *G11C 16/08* | (2006.01) | |
| *G11C 16/10* | (2006.01) | |
| *G11C 11/56* | (2006.01) | |
| *G11C 16/04* | (2006.01) | |

(52) U.S. Cl.
CPC .......... *G11C 16/12* (2013.01); *G11C 11/5628* (2013.01); *G11C 16/0483* (2013.01); *G11C 16/08* (2013.01); *G11C 16/10* (2013.01); *G11C 16/24* (2013.01)

(58) Field of Classification Search
CPC ......... G11C 16/10; G11C 16/08; G11C 16/24; G11C 16/12; G11C 11/5628
USPC .......................... 365/185.28, 185.02, 185.18
See application file for complete search history.

(56) References Cited

U.S. PATENT DOCUMENTS

| | | | |
|---|---|---|---|
| 5,815,451 A | 9/1998 | Tsuchida | |
| 6,185,131 B1 | 2/2001 | Kouchi | |
| 7,145,829 B1 | 12/2006 | Kim | |
| 8,089,811 B2 * | 1/2012 | Kang | G11C 16/24 |
| | | | 365/185.17 |
| 8,514,621 B2 * | 8/2013 | Choi | G11C 11/5628 |
| | | | 365/185.03 |
| 9,171,627 B2 * | 10/2015 | Lee | G11C 16/0483 |

(Continued)

FOREIGN PATENT DOCUMENTS

| | | |
|---|---|---|
| CN | 1540760 A | 10/2004 |
| CN | 101135787 A | 3/2008 |

(Continued)

*Primary Examiner* — Son L Mai
(74) *Attorney, Agent, or Firm* — Winston Hsu (57) ABSTRACT

In a memory device which includes a plurality of memory cells, a top dummy storage region, a bottom dummy storage region, a plurality of word lines and a plurality of bit lines form in a substrate, a selected bit line among the plurality of bit lines, a channel region in the substrate and a source region in the substrate are pre-charged and a negative pre-pulse voltage is applied to the bottom dummy storage region during a first period. A selected memory cell among the plurality of memory cells is programmed during a second period subsequent to the first period, wherein the selected memory cell is coupled to the selected bit line and a selected word line among the plurality of word lines.

15 Claims, 5 Drawing Sheets

(56) References Cited

U.S. PATENT DOCUMENTS

| | | | |
|---|---|---|---|
| 9,454,999 B2 * | 9/2016 | Joo | G11C 16/10 |
| 9,922,705 B1 | 3/2018 | Diep | |
| 10,090,046 B2 * | 10/2018 | Park | G11C 16/28 |
| 2008/0316839 A1 | 12/2008 | Kajigaya | |
| 2010/0046290 A1 | 2/2010 | Park | |

FOREIGN PATENT DOCUMENTS

| | | |
|---|---|---|
| CN | 104347636 A | 2/2015 |
| CN | 105448336 A | 3/2016 |
| CN | 107025923 A | 8/2017 |
| CN | 107170746 A | 9/2017 |
| CN | 108028070 A | 5/2018 |
| CN | 109716440 A | 5/2019 |
| KR | 10-0784862 B1 | 12/2007 |
| TW | 201738965 A | 11/2017 |
| TW | 201909182 A | 3/2019 |

* cited by examiner

METHOD OF PROGRAMMING MEMORY DEVICE AND RELATED MEMORY DEVICE

CROSS REFERENCE TO RELATED APPLICATIONS

This application is a continuation of PCT Application No. PCT/CN2019/112653 filed on 2019 Oct. 23, the entire contents of which are incorporated herein by reference.

BACKGROUND OF THE INVENTION

1. Field of the Invention

The present invention is related a method of programming a memory device and related memory device, and more particularly, to a method of reducing program disturb when programming a memory device with 3D QLC structure and related memory device.

2. Description of the Prior Art

Semiconductor memory has become more popular for use in various electronic devices. For example, non-volatile semiconductor memory is applied in cellular telephones, digital cameras, personal digital assistants, mobile computing devices, non-mobile computing devices and other devices. Recently, ultra high density storage devices have been proposed using a three-dimensional (3D) stacked memory structure sometimes referred to as a Bit Cost Scalable (BiCS) architecture. For example, a 3D NAND stacked flash memory device can be formed from an array of alternating conductive and dielectric layers. A memory hole is drilled in the layers to define many memory layers simultaneously. A NAND string is then formed by filling the memory hole with appropriate materials. Control gates of the memory cells are provided by the conductive layers.

A single-level cell (SLC) non-volatile memory can only store only one bit per memory element, while a multi-level cell (MLC) non-volatile memory can store more than one bit per cell. For example, a NAND memory having 16 voltage levels per cell may be referred to as quad-level cell (QLC) memory and may represent 4 bits of data per cell.

Each planar NAND memory consists of an array of memory cells connected by multiple word lines and bit lines. Data is programmed into or read from the planar NAND memory on a page-by-page basis. In order to mitigate the effect of floating gate-to-floating gate coupling, a 3D QLC NAND memory may be programmed through coarse and fine programming to improve overall programming speed. In a prior art programming method, a first word line is programmed to a first voltage $V_{PGM1}$ with coarse programming, a second word line is programmed to the first voltage $V_{PGM1}$ with coarse programming, the first word line is programmed to a second voltage $V_{PGM2}$ with fine coarse programming, and the second word line is programmed to the second voltage $V_{PGM2}$ with fine coarse programming, wherein $V_{PGM2} > V_{PGM1}$.

During the fine programming of the first word line when the selected bit line is being pre-charged, the signal path between the first and second word lines is cut off and the residual electrons generated when coarse-programming the first word line are unable to be drained. Therefore, the prior art programming method tend to induce program disturb.

SUMMARY OF THE INVENTION

The present invention provides a method of programming a memory device which includes a plurality of memory cells, a top dummy storage region, a bottom dummy storage region, a plurality of word lines and a plurality of bit lines form in a substrate. The method includes pre-charging a selected bit line among the plurality of bit lines, a channel region in the substrate and a source region in the substrate during a first period; applying a negative pre-pulse voltage to the bottom dummy storage region during the first period; and programming a selected memory cell among the plurality of memory cells during a second period subsequent to the first period, wherein the selected memory cell is coupled to the selected bit line and a selected word line among the plurality of word lines.

The present invention also provides a memory device which includes a plurality of word lines, a plurality of bit lines, a first memory string, a second memory string, and a control unit formed in the substrate. The first memory string includes a first top dummy cell; a first bottom dummy cell; a plurality of first memory cells coupled in series between the first top dummy cell and the first bottom dummy cell, and including a selected first memory cell controlled by a first word line among the plurality of word lines and an unselected first memory cell controlled by a second word line among the plurality of word lines; a first top select gate configured to selectively couple the first top dummy cell to a first bit line among the plurality of bit lines; and a first bottom select gate configured to selectively couple the first bottom dummy cell to a first source line. The second memory string includes a second top dummy cell; a second bottom dummy cell; a plurality of unselected second memory cells coupled in series between the second top dummy cell and the second bottom dummy cell, and controlled by the plurality of word lines; and a second top select gate configured to selectively couple the second top dummy cell to a second bit line among the plurality of bit lines; and a second bottom select gate configured to selectively couple the second bottom dummy cell to a second source line. The control unit is configured to pre-charge the first bit line, a channel region in the substrate and a source region in the substrate during a first period, apply a negative pre-pulse voltage to the first bottom dummy cell during the first period, and program the selected first memory cell during a second period subsequent to the first period.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
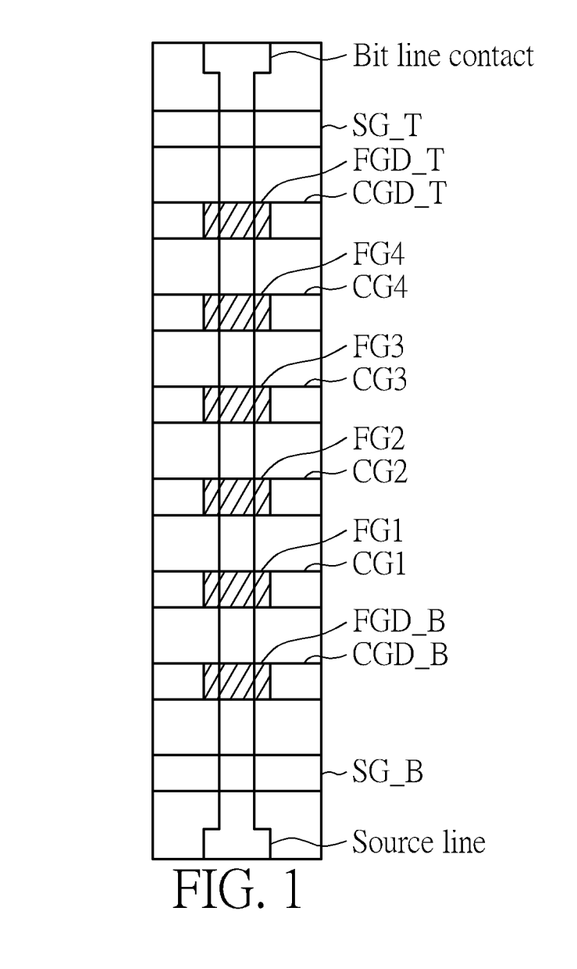
FIG. 1 is a top-view diagram illustrating one NAND string according to an embodiment of the present invention.
Figure 2:
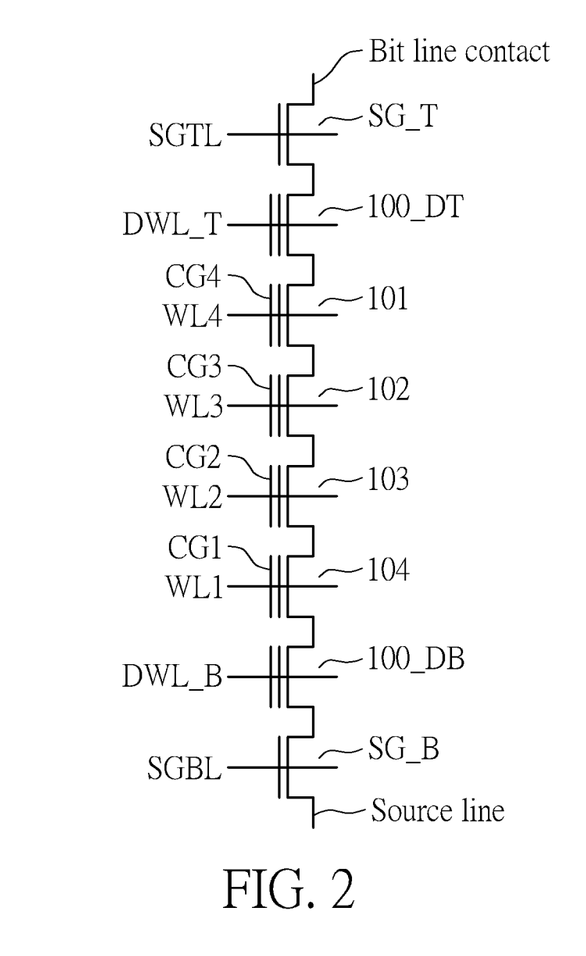
FIG. 2 is a diagram illustrating an equivalent circuit of one NAND string according to an embodiment of the present invention.

FIG. 1 is a top-view diagram illustrating one NAND string according to an embodiment of the present invention. FIG. 2 is a diagram illustrating an equivalent circuit thereof. In a flash memory system using the NAND structure, multiple transistors are arranged in series and sandwiched between two select gates, which are referred to as a NAND string. The NAND string depicted in FIGS. 1 and 2 includes a dummy transistor 100_DT, four transistors 101~104 and a dummy transistor 100_DB coupled in series and sandwiched between a top select gate SG_T (on the drain side) and a bottom select gate SG_B (on the source side). The top select gate SG_T is arranged for connecting the NAND string to a bit line via a bit line contact 126 and may be controlled by applying appropriate voltages to a select gate line SGTL. The bottom select gate SG_B is arranged for connecting the NAND string to a source line and may be controlled by applying appropriate voltages to a select gate line SGBL. Each of the dummy transistor 100_DT, the dummy transistor 100_DB and the transistors 101~104 includes a control gate and a floating gate. For example, the transistor 101 includes a control gate CG1 and a floating gate FG1, the transistor 102 includes a control gate CG2 and a floating gate FG2, the transistor 103 includes a control gate CG3 and a floating gate FG3, the transistor 104 includes a control gate CG4 and a floating gate FG4, the dummy transistor 100_DT includes a control gate CGD_T and a floating gate FGD_T, and the dummy transistor 100_DB includes a control gate CGD_B and a floating gate FGD_B. The control gate CG1 is connected to a word line WL1, the control gate CG2 is connected to a word line WL2, the control gate CG3 is connected to a word line WL3, the control gate CG4 is connected to a word line WL4, the control gate CGD_T is connected to a dummy word line DWL_T, and the control gate CGD_B is connected to a dummy word line DWL_B.

For illustrative purpose, FIGS. 1 and 2 show four memory cells for read/write operation (the transistors 101~104) and two dummy cells for read/write test (the dummy transistors 100_DT and 100_DB) in the NAND string. In other embodiments, a NAND string may include 8 memory cells, 16 memory cells, 32 memory cells, 64 memory cells, 128 memory cells, etc. However, the number of memory cells or dummy cells in a NAND string does not limit the scope of the present invention.

A typical architecture for a flash memory system using a NAND structure includes several NAND strings. Each NAND string is connected to the source line by its bottom select gate SG_B controlled by the select line SGBL and connected to its associated bit line by its top select gate SG_T controlled by the select line SGTL. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 3:
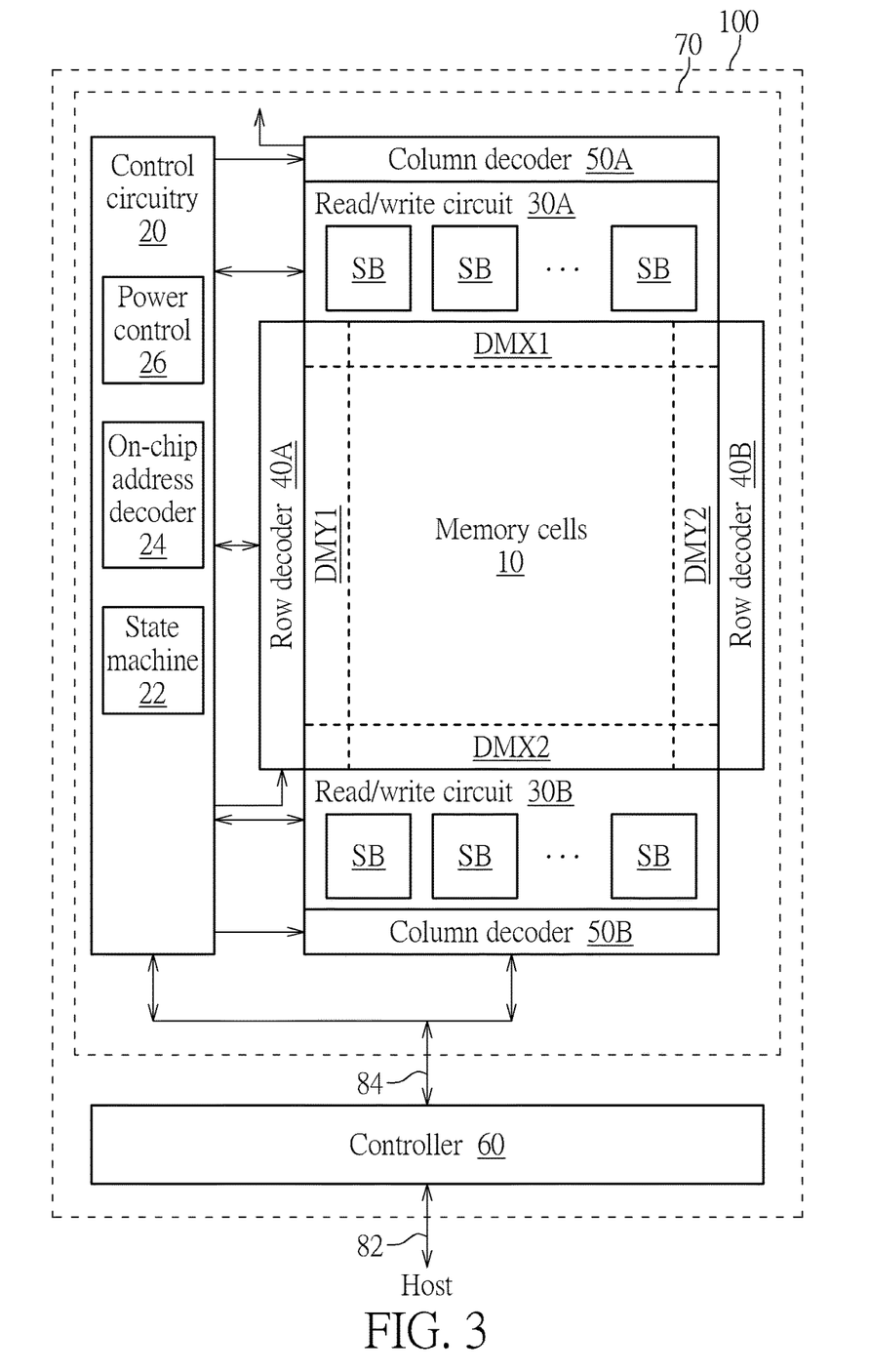
FIG. 3 is a diagram illustrating a memory device having read/write circuits for reading and programming memory cells in parallel according to an embodiment of the present invention.

FIG. 3 is a diagram illustrating a memory device 100 having read/write circuits for reading and programming a page (or other unit) of memory cells in parallel according to an embodiment of the present invention. The memory device 100 includes an array (two-dimensional or three dimensional) of memory cells 10, a control circuitry 20, read/write circuits 30A and 30B, row decoders 40A and 40B, column decoders 50A and 50B, and a controller 60. In one embodiment, access to the memory array 10 by the various peripheral circuits is implemented in a symmetric fashion, on opposite sides of the array, so that the densities of access lines and circuitry on each side are reduced by half. The read/write circuits 30A and 30B include multiple sense blocks SB which allow a page of memory cells to be read or programmed in parallel. The array of memory cells 10 is addressable by word lines via the row decoders 40A and 40B and by bit lines via the column decoders 50A and 50B. In a typical embodiment, the memory cells 10, the control circuitry 20, the read/write circuits 30A and 30B, the row decoders 40A and 40B, and the column decoders 50A and 50B may be fabricated on a memory chip 70. Commands and data are transferred between a host and the controller 60 via a signal line 82 and between the controller 60 and the memory chip 70 via a signal line 84. A plurality of dummy cells, dummy word lines and dummy bit lines (not shown) may be laid in dummy storage areas DMX1-DMX2 and DMY1-DMY2 typically located along the sides of the memory array 10 for running read/write tests after the completion of the memory device 100.

The control circuitry 20 is configured to cooperate with the read/write circuits 30A and 30B for performing memory operations on the array of memory cells 10. The control circuitry 20 includes a state machine 22, an on-chip address decoder 24 and a power control module 26. The state machine 22 is configured to provide chip-level control of memory operations. The on-chip address decoder 24 is configured to provide an address interface between that used by the host or a memory controller to the hardware address used by the row decoders 40A, 40B and the column decoders 50A, 50B. The power control module 26 is configured to control the power and voltages supplied to the word lines and bit lines during each memory operation.

Figure 4:
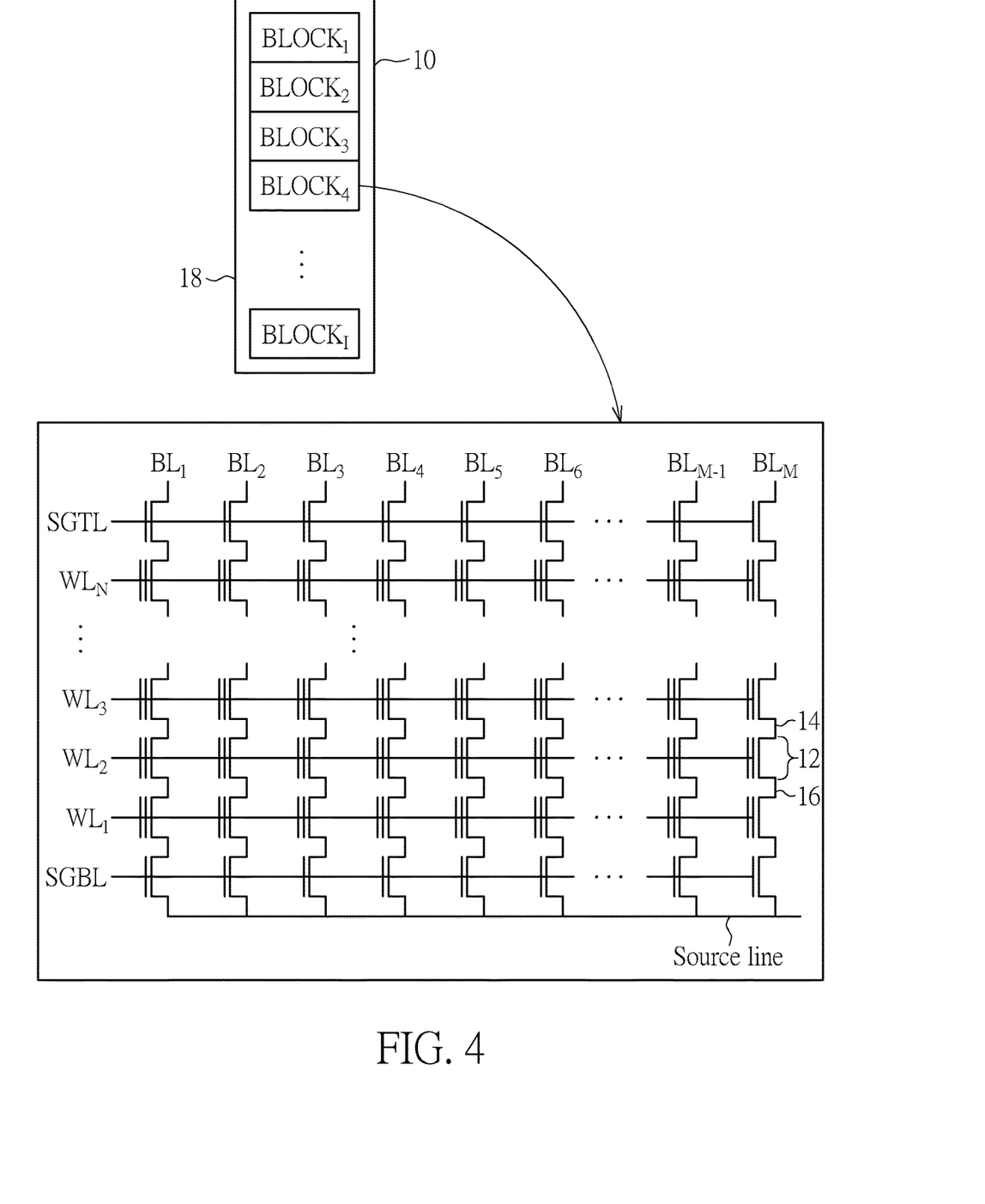
FIG. 4 is a diagram illustrating an exemplary structure of an array of memory cells according to an embodiment of the present invention.

FIG. 4 is a diagram illustrating an exemplary structure of the array of memory cells 10 according to an embodiment of the present invention. The array of memory cells 10 may be fabricated on a substrate 18 and is divided into multiple blocks of memory cells denoted by $BLOCK_1$~$BLOCK_I$, wherein I is a positive integer and typically equal to a large number. The channel region of each memory cell is designated by 12, the source region of each memory cell is designated by 14, and the drain region of each memory cell is designated by 16. A block contains a set of NAND strings which are accessed via bit lines $BL_1$-$BL_M$ and a common set of word lines $WL_1$~$WL_N$, wherein M and N are integers larger than 1. One terminal of the NAND string is connected to a corresponding bit line via the top select gate (controlled by the select gate line SGTL), and another terminal is connected to the source line via the bottom select gate (controlled by the select gate line SGBL). Each block is typically divided into a number of pages. In one embodiment, a block is the unit of conventional erase and a page is the unit of conventional programming. However, other units of erase/program can also be used.

In an embodiment, the array of memory cells 10 includes a triple well comprising a p-type substrate, an n-well within the p-type substrate, and a p-well within the n-well. The channel regions, source regions and drain regions are typically positioned in the p-well. The p-well and n-well are considered part of the p-type substrate, wherein the entire array of memory cells 10 is within one p-well, with trenches in the p-well providing electrical isolation between NAND strings. In another embodiment, the array of memory cells 10 includes a triple well comprising an n-type substrate, a p-well within the n-type substrate, and an n-well within the p-well. The p-well and n-well are considered part of the n-type substrate, wherein the channel regions, the source regions and the drain regions are typically positioned in the n-well. However, the implementation of the memory cells in a NAND string does not limit the scope of the present invention.

In the present invention, the memory device 100 may be a NAND memory device wherein the array of memory cells 10 are laid in a 3D QLC structure. However, the type of the memory device 100 does not limit the scope of the present invention.

Figure 5:
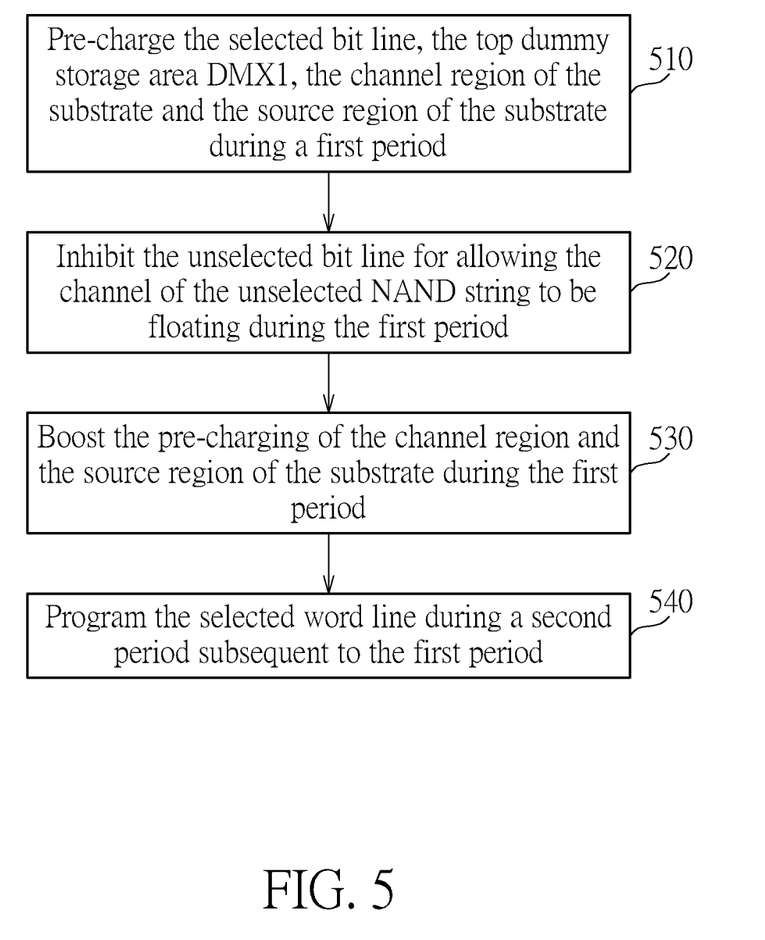
FIG. 5 is a flowchart illustrating a method of reducing program disturb when programming an array of memory cells in a memory device according to an embodiment of the present invention.

FIG. 5 is a flowchart illustrating a method of reducing program disturb when programming the array of memory cells 10 in the memory device 100 according to an embodiment of the present invention. For illustrative purpose, a selected NAND string and an unselected NAND string in the memory device 100 are addressed. The selected NAND string includes a plurality of memory cells controlled by a selected bit line among the plurality of bit lines $BL_1$-$BL_M$ and the common set of word lines $WL_1$~$WL_N$. Among the plurality of memory cells of the selected NAND string, a memory cell to be programmed, referred to as a selected memory cell, is controlled by the selected bit line and a selected word line among the common set of word lines $WL_1$~$WL_N$. Similarly, the unselected NAND string includes a plurality of unselected memory cells controlled by an unselected bit line among the plurality of bit lines $BL_1$-$BL_M$ and the common set of word lines $WL_1$~$WL_N$. The top dummy cell of each NAND string is laid in the dummy storage area DMX1 and the bottom dummy cell of each NAND string is laid in the dummy storage area DMX2, as depicted in FIGS. 1 and 2. The flowchart in FIG. 5 includes the following steps:

Step 510: pre-charge the selected bit line, the top dummy storage area DMX1, the channel region of the substrate and the source region of the substrate during a first period.

Step 520: inhibit the unselected bit line for allowing the channel of the unselected NAND string to be floating during the first period.

Step 530: boost the pre-charging of the channel region and the source region of the substrate during the first period.

Step 540: program the selected word line during a second period subsequent to the first period.

In one embodiment, one or any combination of the control circuitry 20, the read/write circuits 30A and 30B, the row decoders 40A and 40B, the column decoders 50A and 50B, and/or the controller 60 may be referred to as a control unit capable of performing the processes of programming as depicted in FIG. 5.

Figure 6:
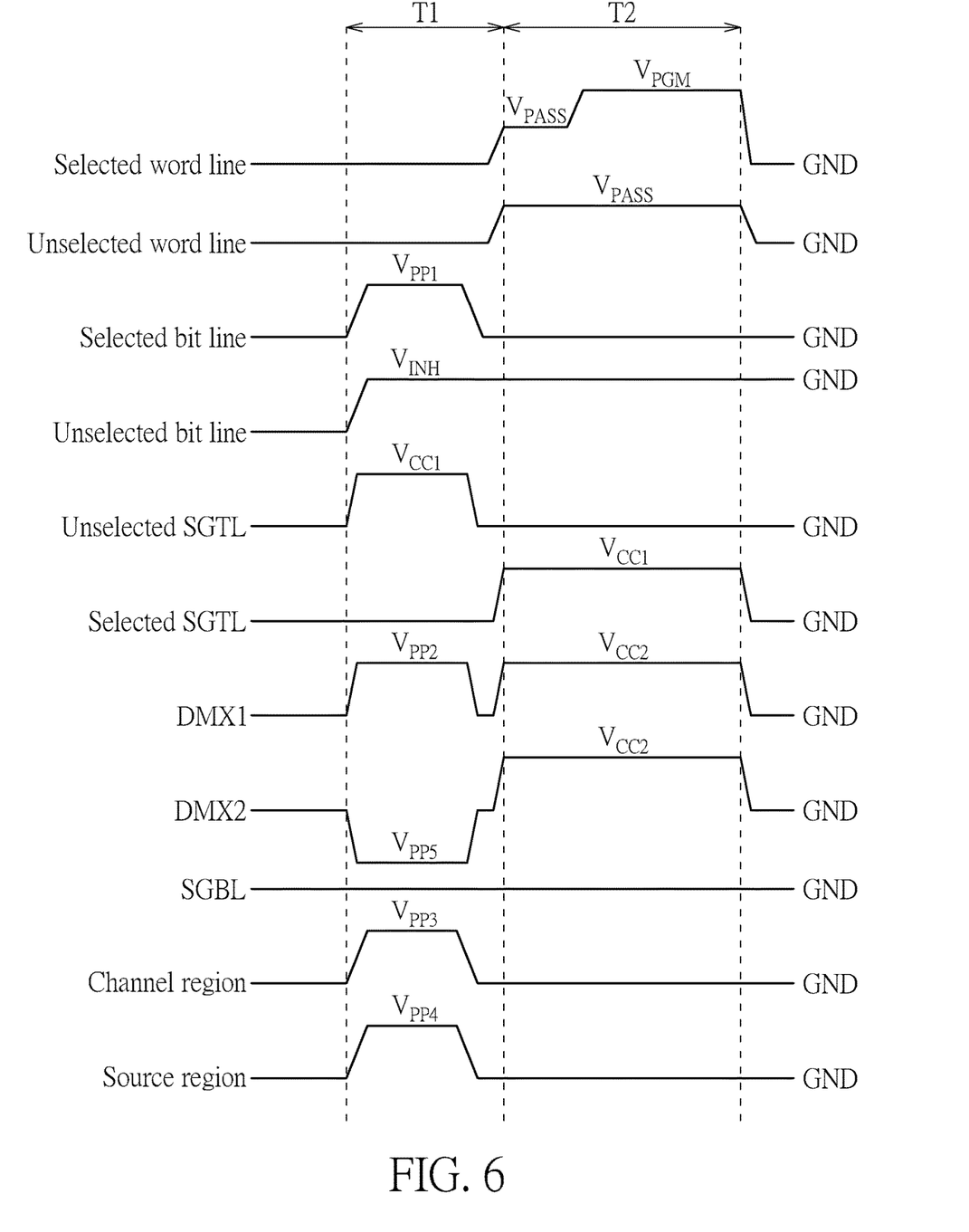
FIG. 6 is a diagram illustrating the levels of related signal lines when executing the method depicted in FIG. 5 according to an embodiment of the present invention.

FIG. 6 is a diagram illustrating the levels of related signal lines when executing the method depicted in FIG. 5. The bias condition of related signal lines is summarized in the following Table 1.

TABLE 1

| Period | T1 | T2 |
|---|---|---|
| selected word line | GND | from $V_{PASS}$ to $V_{PGM}$ |
| unselected word line | GND | $V_{PASS}$ |
| selected bit line | $V_{PP1}$ | $V_{PASS}$ |
| unselected bit line | $V_{INH}$ | $V_{INH}$ |
| unselected top select gate | $V_{CC1}$ | GND |
| selected top select gate | GND | $V_{CC1}$ |
| top dummy storage region DMY1 | $V_{PP2}$ | $V_{CC2}$ |
| bottom dummy storage region DMY2 | $V_{PP5}$ | $V_{CC2}$ |
| bottom select gate | GND | GND |

TABLE 1-continued

| Period | T1 | T2 |
|---|---|---|
| channel region of the substrate | $V_{PP3}$ | GND |
| source region of the substrate | $V_{PP4}$ | GND |

In step 510, the selected bit line, the top dummy storage region DMX1, the channel region and the source region of the substrate may be pre-charged by respectively applying positive pre-pulse voltages $V_{PP1}$-$V_{PP4}$ to the unselected bit line, the top dummy storage region DMX1, the channel region and the source region of the substrate while biasing the word lines at a ground level GND during the first period T1. In an embodiment, $V_{PP1}$=$V_{PP2}$=$V_{PP3}$=$V_{PP4}$. However, the values of the positive pre-pulse voltages $V_{PP1}$-$V_{PP4}$ do not limit the scope of the invention.

In step 520, the unselected bit line may be inhibited by applying a positive inhibit voltage $V_{INH}$ to the unselected bit line while biasing the unselected top select gate line SGTL at a turn-on voltage $V_{CC1}$ and biasing the unselected bottom select gate line SGBL at a ground level GND during the first period T1. Under such circumstances, the unselected NAND string may be floating, thereby reducing the program disturb on the selected word line.

In step 530, the pre-charging of the channel region and the source region in the substrate may be boosted by applying a negative pre-pulse voltage $V_{PP5}$ to the bottom dummy storage region DMX2 during the first period T1. The negative-biased bottom dummy storage region DMX2 can enhance the pre-charging of the channel region and the source region in the substrate, thereby enhancing the coupling effect of the channel region and the source region on the channel of the unselected NAND string and thus further reducing the program disturb on the selected word line.

In an embodiment, the channel region and the source region may be positioned in the p-well of a p-type substrate in which the array of memory cells 10 is formed. In another embodiment, the channel region and the source region may be positioned in the n-well of an n-type substrate in which the array of memory cells 10 is formed. However, the doping type of the channel region and the source region does not limit the scope of the present invention.

In step 540, the selected memory cell 10 on the selected word line may be programed by ramping the selected word line to a pass voltage $V_{PASS}$ and then to a program voltage $V_{PGM}$, biasing the unselected word line at the pass voltage $V_{PASS}$, biasing the selected bit line, the unselected select gate line SGTL and the select gate line SGBL at the ground level GND, biasing the unselected bit line at the inhibit voltage $V_{INH}$, ramping the selected select gate line SGTL to the turn-on voltage $V_{CC1}$, ramping the top dummy storage region DMX1 and the bottom dummy storage region DMX2 to a buffer voltage $V_{CC2}$, and biasing the channel region and the source region in the substrate at the ground level GND. If more than one page on the selected word line is to be programmed, all of the pages to be programmed are programmed prior to proceeding to the next word line.

In the present invention, a negative pre-pulse voltage is applied to the dummy cells located in the bottom dummy storage region of the array of memory cells 10 when pre-charging a selected bit line. Therefore, the coupling effect of the channel region and the source region on the channel of the unselected NAND string may be enhanced, thereby further reducing the program disturb on the selected word line.

What is claimed is:

1. A method of programming a memory device which includes a plurality of memory cells, a top dummy storage region, a bottom dummy storage region, a plurality of word lines and a plurality of bit lines form in a substrate, the method comprising:
pre-charging a selected bit line among the plurality of bit lines by applying a first pre-pulse voltage to an unselected bit line among the plurality of bit lines while biasing the plurality of word lines at a ground level during a first period;
pre-charging a channel region in the substrate by applying a second pre-pulse voltage to the channel region while biasing the plurality of word lines at the ground level during the first period;
pre-charging a source region in the substrate by applying a third pre-pulse voltage to the source region while biasing the plurality of word lines at the ground level during the first period;
applying a negative pre-pulse voltage to the bottom dummy storage region during the first period; and
programming a selected memory cell among the plurality of memory cells during a second period subsequent to the first period, wherein the selected memory cell is coupled to the selected bit line and a selected word line among the plurality of word lines.

2. The method of claim 1, further comprising:
applying a fourth pre-pulse voltage to the top dummy storage region during the first period.

3. The method of claim 2, wherein the first through the fourth pre-pulse voltages are positive voltages.

4. The method of claim 1, further comprising:
programming the selected memory cell by ramping the selected word line to a pass voltage and then to a program voltage during the second period, wherein the program voltage is larger than the pass voltage.

5. The method of claim 4, further comprising:
biasing an unselected word line among the plurality of word lines at the pass voltage, biasing the selected bit line at the ground level, biasing the unselected bit line at an inhibit voltage, ramping the top dummy storage region and the bottom dummy storage region to a buffer voltage, and biasing the channel region and the source region in the substrate at the ground level when programming the selected memory cell during the second period.

6. The method of claim 5, wherein the program voltage, the pass voltage, the inhibit voltage and the buffer voltage are positive voltages.

7. The method of claim 1, further comprising:
applying an inhibit voltage to the unselected bit line during the first period.

8. A memory device, comprising:
a plurality of word lines formed in a substrate;
a plurality of bit lines formed in the substrate;
a first memory string in the substrate and comprising:
a first top dummy cell;
a first bottom dummy cell;
a plurality of first memory cells coupled in series between the first top dummy cell and the first bottom dummy cell, comprising:
a selected first memory cell controlled by a first word line among the plurality of word lines; and
an unselected first memory cell controlled by a second word line among the plurality of word lines;
a first top select gate configured to selectively couple the first top dummy cell to a first bit line among the plurality of bit lines; and
a first bottom select gate configured to selectively couple the first bottom dummy cell to a first source line;
a second memory string comprising:
a second top dummy cell;
a second bottom dummy cell;
a plurality of unselected second memory cells coupled in series between the second top dummy cell and the second bottom dummy cell, and controlled by the plurality of word lines;
a second top select gate configured to selectively couple the second top dummy cell to a second bit line among the plurality of bit lines; and
a second bottom select gate configured to selectively couple the second bottom dummy cell to a second source line; and
a control unit configured to:
pre-charge the first bit line by applying a first pre-pulse voltage to the first bit line while biasing the plurality of word lines at a ground level during a first period;
pre-charge a channel region in the substrate by applying a second pre-pulse voltage to the channel region while biasing the plurality of word lines at the ground level during the first period;
pre-charge a source region in the substrate by applying a third pre-pulse voltage to the source region while biasing the plurality of word lines at the ground level during the first period during the first period;
apply a negative pre-pulse voltage to the first bottom dummy cell during the first period; and
program the selected first memory cell during a second period subsequent to the first period.

9. The memory device of claim 8, wherein
the control unit is further configured to:
apply a fourth pre-pulse voltage to the first top dummy cell during the first period.

10. The memory device of claim 9, wherein the first through the fourth pre-pulse voltages are positive voltages.

11. The memory device of claim 8, wherein the control unit is further configured to:
program the selected first memory cell by ramping the first word line to a pass voltage and then to a program voltage during the second period, wherein the program voltage is larger than the pass voltage.

12. The memory device of claim 11, wherein
the control unit is further configured to:
bias the second word line at the pass voltage during the second period;
bias the first bit line at the ground level during the second period;
bias the second bit line at an inhibit voltage during the second period;
ramp the first top dummy cell and the first bottom dummy cell to a buffer voltage during the second period; and
bias the channel region and the source region in the substrate at the ground level during the second period.

13. The memory device of claim 12, wherein the program voltage, the pass voltage, the inhibit voltage and the buffer voltage are positive voltages.

14. The memory device of claim 8, the control unit is further configured to apply an inhibit voltage to the second bit line during the first period.

15. The memory device of claim 8, wherein the plurality of first and second memory cells are laid in a three-dimensional quad-level cell (3D QLC) structure.

* * * * *